United States Patent [19]
Andersen

[11] Patent Number: 5,196,811
[45] Date of Patent: Mar. 23, 1993

[54] OSCILLATOR CIRCUIT EMPLOYING QUADRATURE NETWORKS FOR MAINTAINING A CONSTANT IMPEDANCE

[75] Inventor: Jorgen W. Andersen, St. Cloud, Fla.

[73] Assignee: Sawtek, Inc., Apopka, Fla.

[21] Appl. No.: 777,890

[22] Filed: Oct. 18, 1991

[51] Int. Cl.$^5$ ............................................. H03B 5/02
[52] U.S. Cl. ............................... 331/135; 331/107 A; 331/177 R
[58] Field of Search ................... 331/107 A, 135, 136, 331/158, 167, 177 R

[56] References Cited
U.S. PATENT DOCUMENTS
4,581,592 4/1986 Bennett ........................... 331/107 A OTHER PUBLICATIONS
Neylon, "Hybrid SAW Oscillators" Microwave Journal, vol. 25, No. 2, Feb. 1982.

Primary Examiner—Siegfried H. Grimm

[57] ABSTRACT

A coupled resonator filter oscillator having an impedance matching network coupled between an amplifier and a filter. The impedance value of the amplifier varies due to amplifier gain compression. The network maintains a constant impedance to the filter when said amplifier's impedance changes to preserve the filter's original transfer function.

15 Claims, 1 Drawing Sheet

OSCILLATOR CIRCUIT EMPLOYING QUADRATURE NETWORKS FOR MAINTAINING A CONSTANT IMPEDANCE

BACKGROUND OF THE INVENTION

This invention relates to coupled resonator filter oscillators. More particularly this invention relates to an oscillator having a resonator filter as a finite impulse response, a filter as the frequency control element and a balanced quadrature amplifier as a sustaining device.

Prior art oscillators use a two pole-pair resonator SAW filter as a frequency control element coupled to an amplifier in an inductorless oscillator circuit. The performance of the prior art oscillators, however, is too imprecise for critical applications, since the oscillator frequency can be anywhere in the resonator filter passband. More demanding applications, requiring outstanding spectral purity and/or frequency accuracy, must maintain better control of the filter to amplifier interface impedance. An impedance mismatch between the filter and the amplifier will distort the filter's transfer function and frequently results in excessive insertion loss.

There is no reason to constrain the filter in an oscillator to two poles. In fact, superior performance can be obtained with four pole-pairs for variable frequency oscillators and six pole-pairs for fixed frequency oscillators. For a given bandwidth, higher order filters have a much steeper phase slope, greatly improving an oscillator's spectral purity.

In the case of acoustic wave guide coupled resonator filters, multiple pole-pairs can be cascaded without the need for intervening matching networks.

Using high order filters to their best effect requires good control of excess oscillator loop gain. It is essential that the filter's magnitude versus frequency characteristic has reduced the oscillator loop gain to less than unity before the loop phase curve versus frequency has reached a second point of positive feedback (commonly referred to as a $\pi$ point).

Also, for other important reasons, excess oscillator loop gain is detrimental to phase noise performance. There should be no more loop gain in the oscillator than is required to start and maintain oscillations under all conditions of temperature, aging, supply voltage variations, and the like.

If the resonator filter is synthesized to represent an approximation to linear phase in the passband (e.g. Bessel, transitional Butterworth-Thomson, equiripple phase, etc.) it can be an excellent frequency control element for variable frequency oscillators, since a linear tuning curve is highly desirable.

As noted earlier, resonator filters, like their electric-wave (having inductors and capacitors) counterparts, require a well defined source and load impedance. Indeed, the source and load impedance are an integral and inseparable part of the filter design. If the filter terminating impedance is changed, virtually all elements in the filter have to be changed to preserve the filter's original transfer characteristic. Any deviation from the filter's design source and load will distort the desired magnitude and phase characteristics of the oscillator. Clearly, precise filter source and load impedance control is necessary to realize the full potential of the resonator oscillator.

Without the addition of some corrective mechanism, the fundamental frequency terminal impedances of the amplifier changes due to amplifier internal power limiting as oscillations build from a small signal to large signal conditions. In short, in a conventional oscillator, the amplifier's input and output impedances are not time invariant, a fact that violates the design supposition of the filter (and other passive circuits in the loop).

Another problem with prior art oscillators is that it is difficult to satisfy the filter, transistor noise figure, gain, and output impedance matching criteria simultaneously. Furthermore, it has been found that it is preferable to use negative feedback in trimming the open loop excess gain. Negative feedback changes both the input and output impedance of the amplifier, representing a further complication in design and manufacturing.

As a practical matter, the oscillator gain and tuning adjustments should be made open loop. Further, the open loop impedance should match the impedance when the loop is closed. Obviously, it would be preferable if the oscillator's impedance could be measured with commonly used test instruments. Again, the change in amplifier impedance precludes accurate tuning and adjustment.

As the amplifier's signal parameters change, it induces insertion phase changes in the other oscillator circuit elements, creating AM/PM conversion, which in turn can degrade the oscillator's spectral purity.

Therefore, a need exists for an improved oscillator wherein the amplifier represents a fixed, time invariant, terminating impedance for both small and large signal conditions. Furthermore, impedance changes due to amplifier adjustments for gain, noise figure, output power, and the like, should be isolated from the frequency control element and other circuits, such as the phase shifter and signal coupling circuits.

SUMMARY OF THE INVENTION

Accordingly, it is an object of the invention to provide an improved oscillator.

Another object of the invention is to provide an oscillator that will take better advantage of the properties of resonator filters used as frequency control elements.

Yet another object of the invention is to provide an oscillator with more predictable and reproducible operation by minimizing or eliminating impedance changes due to an amplifier being driven into non-linear operation.

Still another object of the invention is to provide an oscillator with improved phase noise due to the reduction or elimination of AM to PM conversion caused by the amplifier detuning other, frequency variable, circuits around the loop.

Another object of the design is to provide an oscillator which is easier to design and manufacture by isolating the frequency control element and other tuned circuits from impedance changes in the amplifier.

Yet another object of the invention is to maximize the carrier to noise ratio and phase slope in the loop, said conditions being required for good spectral purity.

In accordance with the above and other objectives there is provided an oscillator which is comprised of a quadrature balanced amplifier, a resonator filter as the frequency control element, a fixed or variable phase shifter which may or may not be embodied in other circuits (e.g., matching networks, etc.), and finally, a signal coupling device such as an equal or unequal power divider. All the foregoing are connected to have equal to or greater than unity gain and zero phase at the desired frequency of operation and have the non-unity gain or non-zero phase for oscillation at any other frequency.

In another preferred embodiment of the invention, an oscillator is provided that comprises filter means for passing electric signals between a predetermined frequency band, and means for amplifying electric signals having a varying output and impedance. A network means for passing signals between said filter and to the amplifying means, and for maintaining a constant impedance to said filter means in response to changes in the variation in the impedance of said amplifier as said amplifying means goes into gain compression.

DESCRIPTION OF THE PREFERRED EMBODIMENTS

Wherever an amplifying device is illustrated in this description, it is to be understood that it may be any three terminal active device in any of its three possible configurations (e.g., common-emitter, common-gate, etc.), or it may be a four terminal device such as the dual gate field effect transistor (FET), or it may represent a circuit such as the cascode circuit, Darlington configuration, etc., or it may represent a complete amplifier including all of its ancillary components for bias and matching, feedback, etc., or it may represent a monolithic integrated circuit or a hybrid amplifier. In short, the invention anticipates that any amplification technique may be used where an amplifying device is illustrated or referred to.

Figure 1:
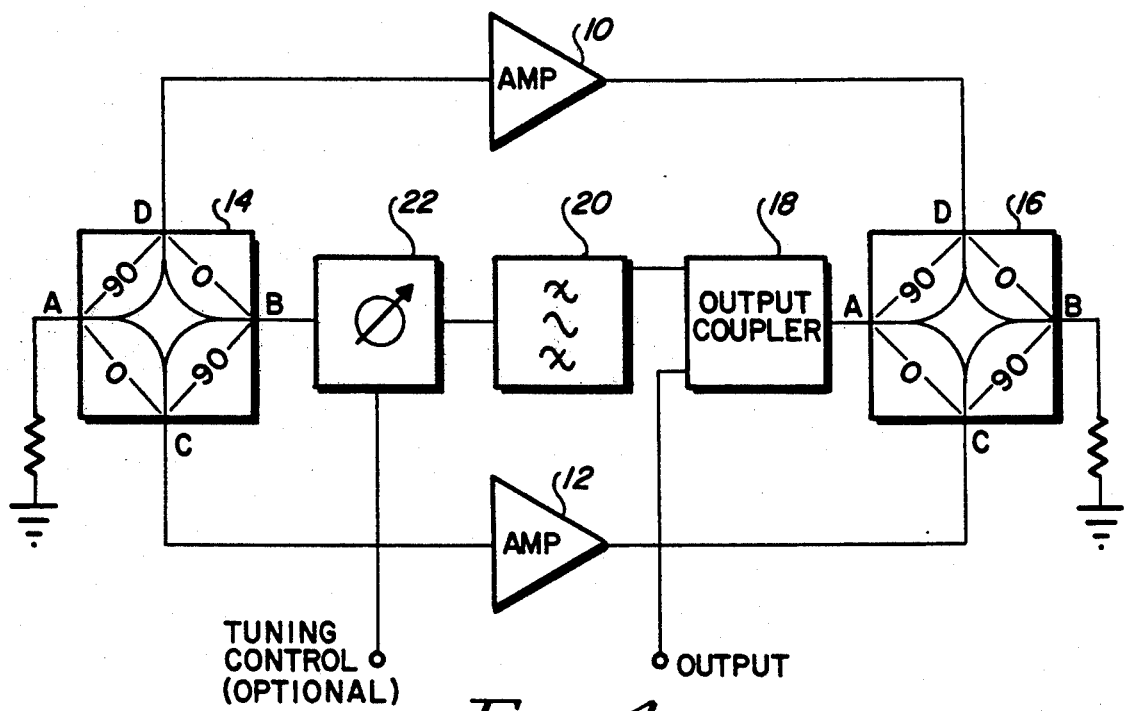
FIG. 1 is a simplified schematic diagram of a resonator filter oscillator incorporating the invention.

Turning to FIG. 1, it is shown that the invention is comprised of two amplifying devices, 10 and 12 having inputs coupled to quadrature hybrid networks 14 and outputs coupled to hybrid networks 16. Serially coupled between quadrature hybrid networks 14 and 16 is an output coupling device 18, a coupled resonator filter 20, and a phase shifter 22. A separate phase shifter is optional and its function may be embodied in other circuits (such as matching networks) in the loop. The output coupler 18 may be a power divider, a directional coupler, or the like. The output coupler, filter, and phase shifter may be interchanged as desired.

Figure 2:
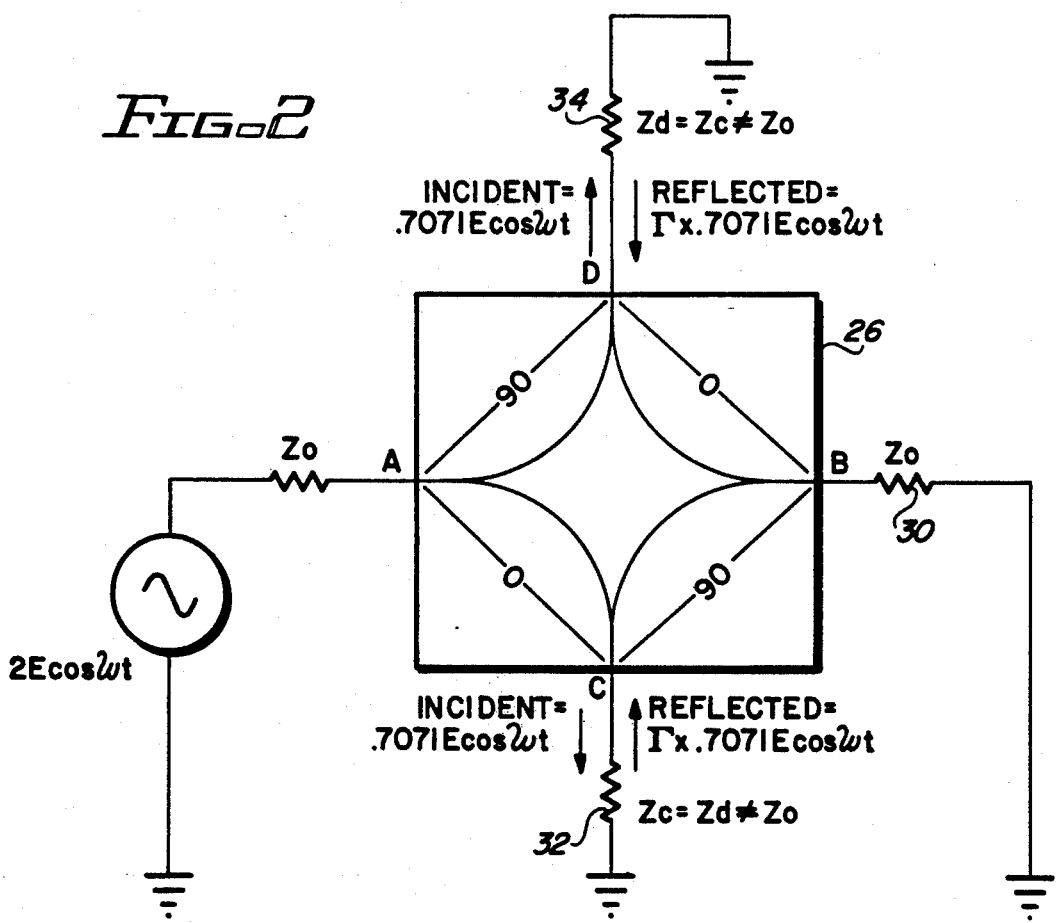
FIG. 2 is a schematic diagram of the quadrature hybrid network shown in FIG. 1 illustrating principles of the invention.

The invention is best understood by considering the operation of quadrature hybrid networks, illustrated separately in FIG. 2.

The quadrature hybrid network 26 in FIG. 2 is a four port linear symmetrical network. Opposite ports (A to B, C to D) of the network are isolated and adjacent ports are coupled (A to C and D, D to A and B, B to C and D, and C to A and B). The termination as seen by parts B, C and D are defined as $Z_B$, $Z_C$ and $Z_D$ respectively. The relative output amplitude is $-3$ dB at each of the two coupled ports and the relative output phase is 0° for one coupled output and 90° for the other.

Consider the case when, in FIG. 2, a carrier is incident to port A and when port B is terminated by impedance 30 having a value of $Z_O$, the reference impedance. If $Z_C$ and $Z_D$ are terminated by impedances 32, 34 respectively with $Z_C = Z_D \neq Z_O$, the energy reflected by these impedances 32 and 34 at ports C and D, respectively cancels at port A and is summed at port B where it is absorbed by termination 30.

This happens because the energy reflected by $Z_D$ experiences a net 180° phase shift as it is coupled back to port A, while energy reflected by $Z_C$ encounters no phase shift, therefore the reflected voltage sums to zero at port A. Since no reflected energy emits from port A, the impedance seen at port A remains equal to $Z_O$.

The reflected energy coupled to port B, however, represents a net 90° phase shift for both $Z_C$ and $Z_D$ and therefore is in phase at port B where it is absorbed by termination impedance 30.

Thus, as long as the impedance of amplifying device 10 in FIG. 1 ($Z_D$ in FIG. 2) is equal to the impedance of amplifying device 12 in FIG. 1 ($Z_C$ in FIG. 2), the quadrature hybrid provides isolation between the resonator filter and the amplifying devices. It is this directional property of the quadrature hybrid that isolates reflections from the amplifiers in FIG. 1 and maintains a constant impedance for the filter 20 in response to changes in the impedance of amplifying devices 10 and 12 as the amplifying devices go into gain compression. Therefore the resonator filter and other circuits always operate at the reference impedance, $Z_O$.

Because the quadrature network is symmetrical, the source, load, and terminated ports may be interchanged as long as their relative port positions are preserved.

Another important property of the quadrature balanced amplifier is a 3 dB extension of dynamic range, which translates directly into a 3 dB improvement in an oscillator's noise floor.

Since the noise mechanisms for the two amplifiers 10 and 12 are uncorrelated, they add as a root mean square (RMS) at the output hybrid. The carrier power is in phase at the output and adds algebraically, hence the 3 dB improvement. For the same reason, the noise figure of the balanced amplifier (neglecting hybrid insertion loss) is the same as that for the individual amplifiers.

This concludes the description of the preferred embodiments. A reading by those skilled in the art will bring to mind various changes without departing from the spirit and scope of the invention. It is intended, however, that the invention only be limited by the following appended claims.

What is claimed is:

1. An oscillator comprising:
    filter means for passing electric signals in a predetermined frequency band;
    means for amplifying the electric signals, the amplifying means having a varying output and impedance; and
    network means for passing the electric signals between the filter means and the amplifying means, and for maintaining a constant impedance in response to variations in the impedance as the amplifying means goes into gain compression, the network means including a first and a second quadrature network, where said first network is coupled between an output of said amplifying means and an input of said filter means, and said second network is coupled between an input of said amplifying means and an output of said filter means.

2. The oscillator as recited in claim 1 wherein said amplifying means includes a plurality of amplifiers coupled to said network means.

3. The oscillator as recited in claim 1 further comprising means for shifting the phase of said signals passing between the filter means and said network means.

4. The oscillator as recited in claim 3 wherein said shifting means shifts the phase of said signals in response to variations in a voltage level of a control signal.

5. The oscillator as recited in claim 1 further comprising an output coupler means for receiving signals from said network means and for providing oscillating output signal in response to said signals from said network means.

6. An oscillator comprising:
   a resonator filter means having an input and an output, and adapted to pass electronic signals having a frequency in a predetermined frequency band;
   a plurality of balanced amplifiers for amplifying said electronic signals, said amplifiers having an input and an output;
   a first quadrature hybrid network means for passing signals between said filter means output and the inputs of the amplifiers, and for maintaining a constant impedance to said filter means output when the amplifiers enter gain compression; and
   a second quadrature hybrid network means for passing signals between said filter means input and the outputs of the amplifiers, and for maintaining constant impedance to said filter means input when the amplifiers enter gain compression.

7. The oscillator as recited in claim 6 wherein said filter means includes means coupled in series for shifting the phase of said signals coupled through said filter means.

8. The oscillator as recited in claim 6 wherein each of said first and second quadrature hybrid network means has four terminals where one of said terminals is coupled to the first amplifier, and another of said terminals is coupled to the second amplifier, a third of said terminals is terminated into a fixed predetermined impedance and the fourth of said terminals is coupled to said filter means.

9. An oscillator comprising:
   a resonator filter having an input and an output;
   first and second amplifiers, each amplifier having an input and output impedance that changes when said amplifiers go into gain compression; and
   a first and a second quadrature hybrid network, each network having first and second terminals coupled to the input or the output of said first and second amplifiers respectively, a third terminal terminating into a fixed predetermined impedance, and a fourth terminal coupled to the input or the output of said resonator filter respectively.

10. The oscillator as recited in claim 9 wherein each of said networks provides a 90° phase shift between said first and fourth terminals.

11. The oscillator as recited in claim 10 wherein each of said networks further provides a second 90° phase shift between said second and third terminals.

12. The oscillator as recited in claim 9 further comprising a phase shifter coupled between one of said networks and said resonator filter.

13. The oscillator as recited in claim 12 wherein said phase shifter includes means for phase shifting a signal passing through said phase shifter in response to a control signal.

14. The oscillator as recited in claim 9 further comprising an output coupler electrically coupled between said resonator filter and one of said hybrid networks, said output coupler providing an output oscillating signal.

15. An electronic circuit, comprising:
   a filter having an input and output for passing electronic signals having a frequency in a predetermined frequency band;
   a first amplifier having an input impedance and an output impedance which both change when the first amplifier goes into gain compression;
   a second amplifier having an input impedance and an output impedance both of which change when the second amplifier goes into gain compression;
   a first quadrature hybrid network having first, second, third and fourth terminals, with the first terminal coupled to the input of the first amplifier, the second terminal coupled to the input of the second amplifier, the third terminal terminating in a fixed predetermined impedance, and the fourth terminal coupled to the input of the filter;
   a second quadrature hybrid network having first, second, third and fourth terminals, with the first terminal coupled to the output of the first amplifier, the second terminal connected to the output of the second amplifier, the third terminal terminating in a fixed predetermined impedance, and the fourth terminal coupled to the output of the filter; and wherein
   the first and second quadrature hybrid networks maintain a constant impedance to the filter in response to variations in the impedance of the first and second amplifiers as each goes into gain compression.

* * * * *